United States Patent
Tekumalla (10) Patent No.: US 8,751,884 B2
(45) Date of Patent: Jun. 10, 2014

(54) SCAN TEST CIRCUITRY WITH SELECTABLE TRANSITION LAUNCH MODE

(75) Inventor: Ramesh C. Tekumalla, Breinigsville, PA (US)

(73) Assignee: LSI Corporation, San Jose, CA (US)

( * ) Notice: Subject to any disclaimer, the term of this patent is extended or adjusted under 35 U.S.C. 154(b) by 170 days.

(21) Appl. No.: 13/459,424

(22) Filed: Apr. 30, 2012

(65) Prior Publication Data

US 2013/0290799 A1 Oct. 31, 2013

(51) Int. Cl.
*G01R 31/28* (2006.01)

(52) U.S. Cl.
USPC .......................... 714/731; 714/727; 714/729

(58) Field of Classification Search
USPC ............. 702/117; 710/74; 714/729, 731, 727, 714/726, 733
See application file for complete search history.

(56) References Cited

U.S. PATENT DOCUMENTS

| | | | |
|---|---|---|---|
| 6,877,123 B2 | 4/2005 | Johnston et al. | |
| 7,058,869 B2 * | 6/2006 | Abdel-Hafez et al. | 714/729 |
| 7,266,742 B1 | 9/2007 | Pandey | |
| 7,475,173 B2 * | 1/2009 | Nemazie et al. | 710/74 |
| 7,747,920 B2 * | 6/2010 | Wang et al. | 714/731 |
| 7,831,876 B2 | 11/2010 | Goyal et al. | |
| 8,311,762 B1 * | 11/2012 | Hartanto et al. | 702/117 |
| 2012/0102376 A1 * | 4/2012 | Shtulman et al. | 714/731 |
| 2012/0221906 A1 * | 8/2012 | Shetty et al. | 714/727 |

OTHER PUBLICATIONS

N. Ahmed et al., "Improving Transition Delay Fault Coverage Using Hybrid Scan-Based Technique," IEEE 20th International Symposium on Defect and Fault Tolerance in VLSI Systems (DFT), Oct. 2005, pp. 187-195.

Gefu Xu, "Delay Test Scan Flip-Flop (DTSFF) Design and its Applications for Scan Based Delay Testing," Auburn University, Dissertation, Dec. 2007, 125 pages.

R. Kumar et al., "An Efficient Pulse Flip-Flop Based Launch-on-Shift Scan Cell," IEEE International Symposium on Circuits and Systems (ISCAS), May-Jun. 2010, pp. 4105-4108, Paris, France.

S. Wu et al., "Logic BIST Architecture Using Staggered Launch-on-Shift for Testing Designs Containing Asynchronous Clock Domains," IEEE 25th International Symposium on Defect and Fault Tolerance in VLSI Systems (DFT), Oct. 2010, pp. 358-366, Kyoto, Japan.

R. Kumar et al., "A Robust Pulsed Flip-Flop and its Use in Enhanced Scan Design," IEEE International Conference on Computer Design (ICCD), Oct. 2009, pp. 97-102.

(Continued)

*Primary Examiner* — David Ton
(74) *Attorney, Agent, or Firm* — Ryan, Mason & Lewis, LLP (57) ABSTRACT

An integrated circuit comprises scan test circuitry and additional circuitry subject to testing utilizing the scan test circuitry. The scan test circuitry comprises at least one scan chain having scan cells. The scan test circuitry further comprises transition launch mode selection circuitry configured to provide independent selection between multiple transition launch modes for each of a plurality of clock domains of the integrated circuit. The multiple transition launch modes may include, for example, at least a launch-on-shift mode and a launch-on-capture mode. These transition launch modes provide different manners of launching a given signal transition via at least one of the scan cells in a corresponding one of the clock domains. The transition launch mode selection circuitry may be configured to generate from a common shift enable signal multiple independently controllable shift enable signals for respective ones of the clock domains of the integrated circuit.

20 Claims, 4 Drawing Sheets

(56) References Cited

OTHER PUBLICATIONS

I. Park et al., "Launch-on-Shift-Capture Transition Tests," IEEE International Test Conference (ITC), Oct. 2008, pp. 1-9.

S. Bhunia et al., "A Novel Low-Overhead Delay Testing Technique for Arbitrary Two-Pattern Test Application," IEEE Design, Automation and Test in Europe Conference and Exhibition (DATE), Mar. 2005, pp. 1136-1141, Munich, Germany.

N. Devtaprasanna et al., "A Novel Method of Improving Transition Delay Fault Coverage Using Multiple Scan Enable Signals," IEEE 23rd International Conference on Computer Design (ICCD), Oct. 2005, 4 pages.

* cited by examiner

SCAN TEST CIRCUITRY WITH SELECTABLE TRANSITION LAUNCH MODE

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain are configurable to form a serial shift register for applying test patterns at inputs to combinational logic of the integrated circuit. The scan cells of the given scan chain are also used to capture outputs from other combinational logic of the integrated circuit.

Scan testing of an integrated circuit may therefore be viewed as being performed in two repeating phases, namely, a scan shift phase in which the flip-flops of the scan chain are configured as a serial shift register for shifting in and shifting out of respective input and output scan data, and a scan capture phase in which the flip-flops of the scan chain capture scan data from combinational logic. These two repeating scan test phases are often collectively referred to as a scan test mode of operation of the integrated circuit.

Outside of the scan test mode and its scan shift and capture phases, the integrated circuit may be said to be in a functional mode of operation. Other definitions of the scan test and functional operating modes may also be used. For example, the capture phase associated with a given scan test may instead be considered part of a functional mode of operation, such that the modes include a scan shift mode having only the scan shift phase, and a functional mode that includes the capture phase.

In scan testing of an integrated circuit, signal transitions associated with various applied test patterns are "launched" via the scan cells. Such transitions may be launched using a variety of different techniques, including launch-on-shift and launch-on-capture techniques, which are also referred to herein as respective "launch modes." In the launch-on-shift technique, a signal transition is launched from a scan input of a scan cell to an output of the scan cell, while in the launch-on-capture technique, a signal transition is launched from a functional input of the scan cell to an output of the scan cell. It should be noted that the scan cell may include separate scan and functional outputs, or a single common scan and functional output.

Integrated circuits commonly include multiple clock domains. In an integrated circuit of this type, different portions of the integrated circuit are provided with different clock signals via a clock distribution network. Different scan chains or other types of sets of scan cells, including multiple sets of scan cells of a given single scan chain, may each be associated with a different clock domain.

In conventional practice, the scan cells of the multiple clock domains are all typically configured to utilize the same transition launch technique at the same time. For example, all of the clock domains at a particular launch time may be configured to utilize either the launch-on-shift technique or the launch-on-capture technique. Thus, the multiple clock domains either all launch signal transitions using the scan inputs of the scan cells or all launch signal transitions using the functional inputs of the scan cells. Such an arrangement tends to place significant limitations on the flexibility of the scan testing operation. As a result, test duration may be unduly increased for a given level of fault coverage, or fault coverage may be unduly limited for a given test duration.

SUMMARY

One or more illustrative embodiments of the invention provide transition launch mode selection circuitry that allows different transition launch modes to be selected at the same time for respective clock domains of an integrated circuit. Such an arrangement, for example, allows the launch mode to be selected independently for different clock domains within the same applied test pattern. Also, for a given scan cell, one launch mode may be used for a first test pattern and another launch mode for a second test pattern. The launch mode can be selected in real time, thereby facilitating test pattern generation and providing better fault coverage for a given test pattern.

In one embodiment, an integrated circuit comprises scan test circuitry and additional circuitry subject to testing utilizing the scan test circuitry. The scan test circuitry comprises at least one scan chain having a plurality of scan cells. The scan test circuitry further comprises transition launch mode selection circuitry configured to provide independent selection between multiple transition launch modes for each of a plurality of clock domains comprising respective sets of the scan cells.

The multiple transition launch modes may include, for example, at least a launch-on-shift mode and a launch-on-capture mode. These transition launch modes provide different manners of launching a given signal transition via at least one of the scan cells in a corresponding one of the clock domains.

The transition launch mode selection circuitry may be configured to generate from a common shift enable signal multiple independently controllable shift enable signals for respective ones of the clock domains of the integrated circuit.

The illustrative embodiments provide significant advantages relative to conventional practice. For example, use of launch-on-shift or launch-on-capture can be selected independently for each of the clock domains of the integrated circuit, and therefore some clock domains can launch signal transitions using the scan inputs of their associated scan cells while at the same time other clock domains launch signal transitions using the functional inputs of their associated scan cells. This considerably enhances the flexibility of the scan testing operation, leading to a shorter test duration for a given level of fault coverage, or improved fault coverage for a given test duration.

DETAILED DESCRIPTION

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved scan testing performance by controllably selecting between different transition launch modes for different clock domains in conjunction with scan testing.

Figure 1:
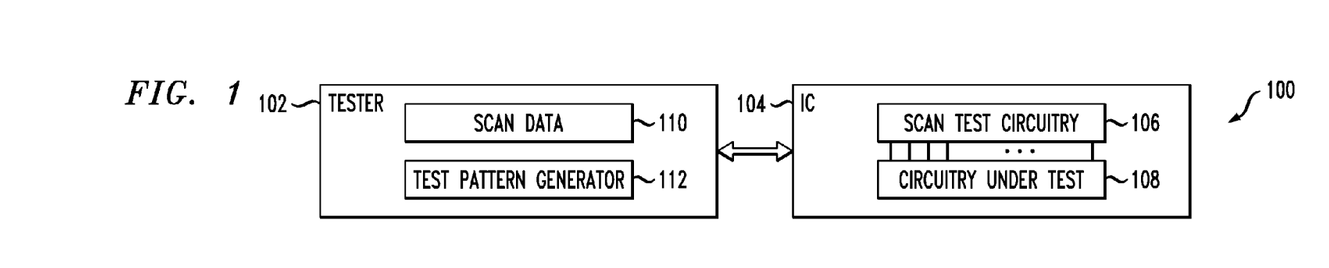
FIG. 1 is a block diagram showing an integrated circuit testing system comprising a tester and an integrated circuit under test in an illustrative embodiment.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and embodiments of the invention are not limited in this regard. However, the illustrative embodiment shown in FIG. 2 will be described primarily in the context of compressed scan testing.

Figure 2:
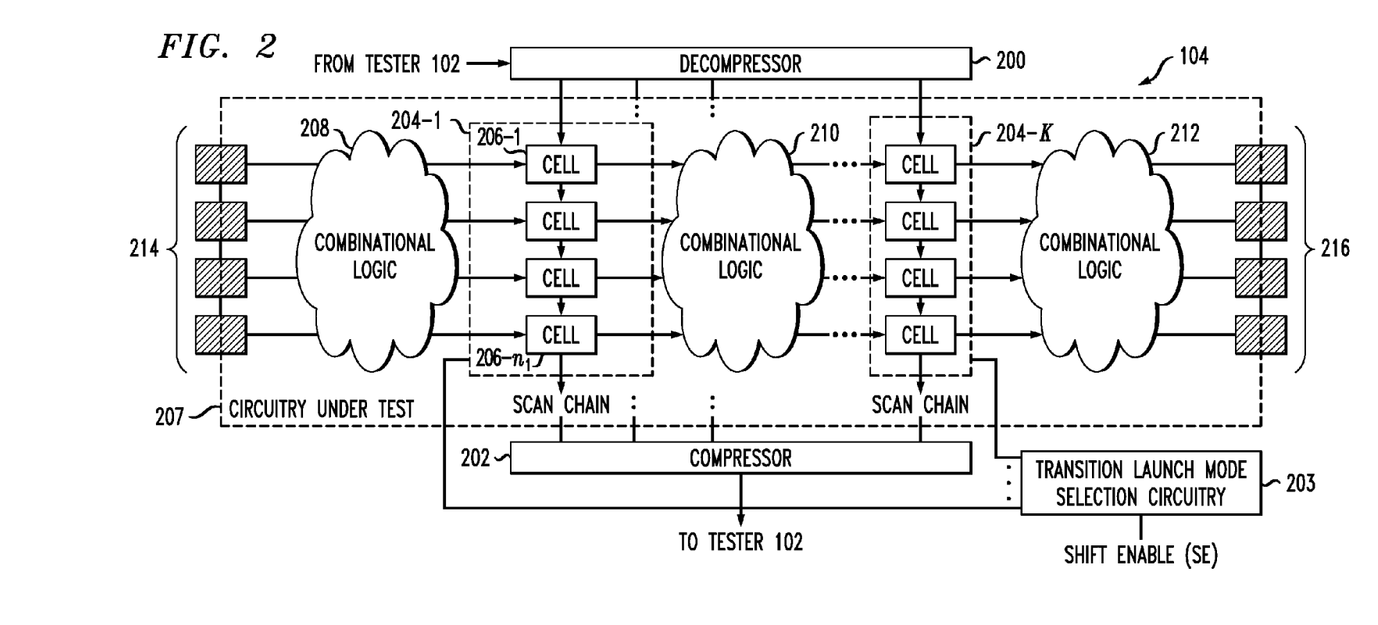
FIG. 2 shows a more detailed view of a portion of the integrated circuit of FIG. 1.

Referring now to FIG. 2, portions of one potential configuration of the integrated circuit 104 are shown in greater detail. In this compressed scan testing arrangement, the scan test circuitry 106 comprises a decompressor 200, a compressor 202, transition launch mode selection circuitry 203, and a plurality of scan chains 204-$k$, where k=1, 2, ... K.

Each of the scan chains 204 comprises a plurality of scan cells 206, and is configurable to operate as a serial shift register in a scan shift mode of operation of the integrated circuit 104 and to capture functional data from circuitry under test 207 in a functional mode of operation of the integrated circuit 104. The scan chains 204 may be associated with multiple distinct clock domains, or a single clock domain. However, it will be assumed for embodiments to be described herein that the scan chains are associated with multiple clock domains. Each such clock domain is associated with or otherwise comprises a corresponding set of the scan cells 206 of one or more of the scan chains 204. The term "set of scan cells" in this context is intended to be broadly construed, so as to encompass, for example, a corresponding sub-chain of a given one of the scan chains 204.

As will be described in greater detail below, the transition launch mode selection circuitry 203 is configured to provide independent selection between multiple transition launch modes for each of a plurality of clock domains of the integrated circuit 104. The multiple transition launch modes may include, for example, at least a launch-on-shift mode and a launch-on-capture mode. These transition launch modes provide different manners of launching a given signal transition via at least one of the scan cells in a corresponding one of the clock domains.

In the present embodiment, the transition launch mode selection circuitry 203 is configured to generate, from a single common shift enable signal (SE) applied to that circuitry as shown in the figure, multiple independently controllable shift enable signals for respective ones of the clock domains of the integrated circuit 104. The multiple independently controllable shift enable signals are denoted herein as $SE_i$, where i=1, 2, ... N denotes a particular one of N clock domains of the integrated circuit 104.

Although illustratively shown as part of the integrated circuit 104 in the present embodiment, the transition launch mode selection circuitry 203 in other embodiments may be implemented at least in part off-chip, such as within the tester 102.

The scan chains 204 are generally arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In some embodiments of the invention, the lengths of the scan chains 204 are balanced so that the same amount of time is needed to shift the desired set of scan test patterns into all of the scan chains. It may therefore be assumed without limitation that all of the scan chains 204 are of the same length n, such that $n_1=n_2= \ldots =n_k=n$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift mode of operation. The compressor 202 of the scan test circuitry 106 receives scan test output data shifted out of the scan chains 204, also when such chains are configured as respective serial shift registers in the scan shift mode of operation, and compresses that scan test output data for delivery back to the tester 102.

Compressed scan input data is applied by tester 102 to M scan inputs of decompressor 200, and compressed scan output data is provided from compressor 202 back to tester 102 via M scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift mode of operation of the integrated circuit 104 and also to capture functional data from combinational logic elements in the functional mode of operation of the integrated circuit 104.

The number K of scan chains 204 is generally much larger than the number M of decompressor inputs or compressor outputs. The ratio of K to M provides a measure of the degree of scan test pattern compression provided in the scan test circuitry 106. It should be noted, however, that the number of compressor outputs need not be the same as the number of decompressor inputs. For example, there may be M decompressor inputs and P compressor outputs, where M≠P but both M and P are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in U.S. Pat. No. 7,831,876, entitled "Testing a Circuit with Compressed Scan Subsets," which is commonly assigned herewith and incorporated by reference herein. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern. Other types of shift modes or phases can be used.

Each of the scan cells 206 is assumed to have a functional data input (D), a scan input (SI), a shift enable input (SE) and an output (Q), although it may include other inputs and outputs, as will be appreciated by those skilled in the art. The same scan cell output may serve as a scan output in the scan shift mode of operation and as a functional data output in the functional mode of operation, or the scan cell may provide separate scan and functional data outputs. It is to be appreciated, however, that embodiments of the invention are not limited in terms of the type of scan cells that are used in the scan chains 204.

A shift enable signal applied to the shift enable inputs of a given chain or other set of the scan cells 206 at a particular logic level causes the scan cells of that set to form a serial shift register during scan testing. For example, the scan cells of the set can form a serial shift register responsive to the SE signal being at a first designated logic level (e.g., a logic "1" level) and the scan cells of the set can capture functional data when the SE signal is at a second designated logic level (e.g., a logic "0" level). Other logic levels and shift enable signaling arrangements can be used in other embodiments.

In testing for a delay fault using scan cells of the type described above, the target fault can be on a path between two scan cells. The fault site is activated with an appropriate transition at a source scan cell and the transition is propagated and detected at a destination scan cell.

The transition can be launched by configuring the source scan cell such that its SI input and Q output are at opposite logic levels, and then launching the transition from SI to Q by clocking the scan cell while its SE input is set to a logic "1" level. This is an example of a launch-on-shift mode that utilizes the scan input of the source scan cell to launch a transition. Alternatively, the transition can be launched by configuring the source scan cell such that its D input and Q output are at opposite logic levels, and then launching the transition from D to Q by clocking the scan cell while its SE input is set to a logic "0" level. This is an example of a launch-on-capture mode that utilizes the functional input of the source scan cell to launch a transition.

As indicated previously, conventional arrangements are generally configured such that all of the clock domains of an integrated circuit utilize the same transition launch technique at any given time. We have determined that such arrangements can be particularly disadvantageous. For example, if the launch-on-capture technique is used by all the clock domains, the test generation tool is unable to launch a transition using the SI to Q path of a given scan cell, even if there is no transition possible on the D to Q path of the given scan cell. Similarly, if the launch-on-shift technique is used by all the clock domains, the test generation tool is unable to launch a transition using the D to Q path of a given scan cell, even if there is no transition possible on the SI to Q path of the given scan cell. This unduly limits the number of combinations possible for transition activation and corresponding detection of a fault and could result in the use of more test patterns than necessary, leading to longer test times.

Such drawbacks of conventional practice are overcome in one or more embodiments by configuring the integrated circuit 104 to permit transition launch modes to be selected independently for respective clock domains. As noted above, each such clock domain is associated with a different set of the scan cells 206 of one or more of the scan chains 204. It is assumed that the available transition launch modes include a launch-on-shift mode and a launch-on-capture mode, although other types of launch modes may be used in other embodiments. It was indicated previously that these transition launch modes provide different manners of launching a given signal transition via at least one of the scan cells in a corresponding one of the clock domains.

The transition launch mode selection functionality is provided by transition launch mode selection circuitry 203, which is driven by the common shift enable signal SE, as will now be described in greater detail with reference to FIGS. 3 through 6.

Figure 3:
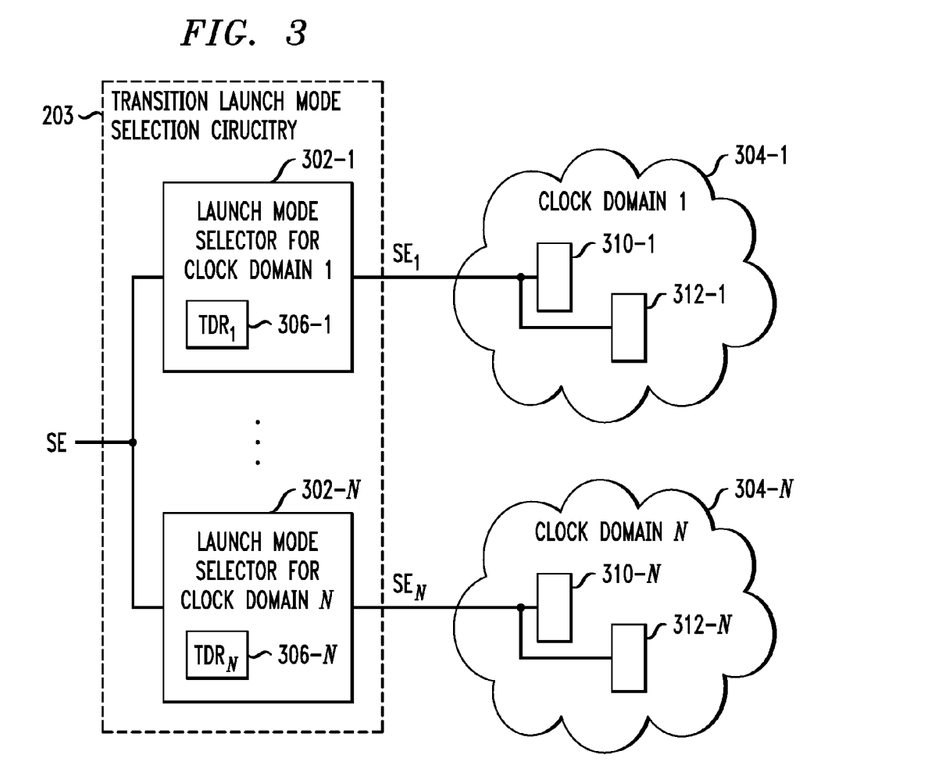
FIG. 3 illustrates transition launch mode selection circuitry of the FIG. 1 integrated circuit in one embodiment.

Referring initially to FIG. 3, the illustrated portion of integrated circuit 104 comprises transition launch mode selection circuitry 203. The transition launch mode selection circuitry 203 comprises a plurality of transition launch mode selectors 302-1, 302-2, . . . 302-N for independently selecting between a launch-on-shift mode and a launch-on-capture mode for respective ones of the clock domains 304-1, 304-2, . . . 304-N of the integrated circuit. Each clock domain 304 comprises circuitry including flip-flops 310 and 312 as indicated, which may correspond to respective ones of the scan cells 206. These flip-flops are assumed to have respective shift enable inputs that receive a shift enable signal separately generated for the corresponding clock domain.

Each of the transition launch mode selectors 302 of the transition launch mode selection circuitry 203 receives as an input the common shift enable signal SE and generates as an output an independently controllable shift enable signal denoted herein as $SE_i$, where i=1, 2, . . . N denotes a particular one of N clock domains of the integrated circuit 104. Exemplary implementations of a given one of the transition launch mode selectors 302-$i$ will be described below in conjunction with FIGS. 4, 5 and 6, respectively. The transition launch mode selectors 302 are generally configured to generate from the common shift enable signal SE multiple independently controllable shift enable signals $SE_i$ for respective ones of the clock domains 304 of the integrated circuit.

The common shift enable signal SE may be a chip-level signal supplied to the integrated circuit 104 by the tester 102. The independently controllable shift enable signal $SE_i$ generated from the common shift enable signal SE is applied to the shift enable inputs of each of the scan cells associated with clock domain 304-$i$. In other words, all of the scan cells 206 on the same clock domain share the same $SE_i$ signal.

A designated logic level of a given one of the shift enable signals $SE_i$ is associated with a particular selected one of the multiple transition launch modes. More particularly, the $SE_i$ signal being at a logic "1" level is associated with use of a launch-on-shift mode for launching transitions in the corresponding clock domain 304-$i$, and the $SE_i$ signal being at a logic "0" level is associated with use of a launch-on-capture mode for launching transitions in the corresponding clock domain 304-$i$.

As mentioned previously, the transition launch mode can therefore be established separately for each of the clock domains 304, such that some of the clock domains 304 can operate in the launch-on-shift mode at that same time that other ones of the clock domains 304 are operating in the launch-on-capture mode.

Such an arrangement allows a test generation tool to select use of either launch-on-shift or launch-on-capture separately for each of the clock domains 304. Transitions can therefore be launched from either the functional path or the scan path of the scan cells of each clock domain depending on which launch technique results in better fault coverage for a given pattern within that domain. The test generation tool can determine in real time which launch mode to use for each clock domain and test pattern. Thus, for example, the launch mode can be selected independently for different clock domains within the same applied test pattern. Also, for a given scan cell, one launch mode may be used for a first test pattern and another launch mode for a second test pattern.

Figure 4:
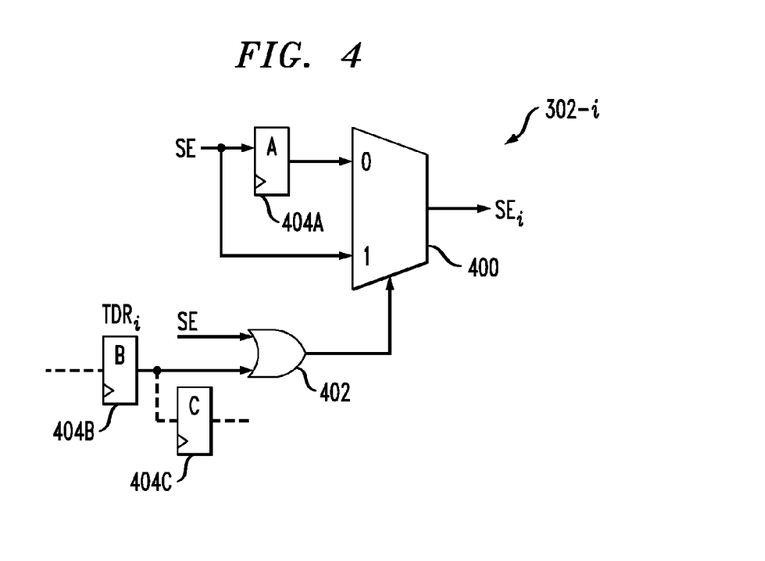
FIGS. 4, 5 and 6 are schematic diagrams showing respective exemplary implementations of a given launch mode selector of the FIG. 3 transition launch mode selection circuitry.

Turning now to FIG. 4, a given launch mode selector 302-$i$ in this embodiment comprises a multiplexer 400, a logic gate 402, and first, second and third flip-flops denoted 404A, 404B and 404C, respectively. The multiplexer 400 is illustratively implemented as a two-to-one multiplexer having a first input adapted to receive the common shift enable signal SE, a second input coupled to an output of the first flip-flop 404A, a select line coupled to an output of the logic gate 402, and an output providing the independently controllable shift enable signal $SE_i$ for clock domain 304-$i$. The logic gate 402 is illustratively implemented as a two-input OR gate having a first input adapted to receive the common shift enable signal SE, and a second input coupled to an output of the second flip-flop 404B. The second flip-flop 404B stores a control bit for controlling the transition launch mode for clock domain 304-$i$ between the launch-on-shift mode and the launch-on-capture mode. It should be noted that, in embodiments in which there are more than two launch modes, more than one control bit may be used to indicate the selected mode.

In the FIG. 4 embodiment, when SE is at a logic "1" level, $SE_i$ is also at a logic "1" level. This corresponds to the above-noted scan shift phase. During this phase, the launch mode selector 302-$i$ is essentially transparent, and the common shift enable signal SE is applied to the shift enable inputs of the respective scan cells of clock domain 304-$i$. At the end of the scan shift phase, SE is set to 0, the output of the first flip-flop 404A is 1 and its input is 0. So when SE=0, the selected multiplexer input depends on the output of the second flip-flop 404B. The clock applied to the clock input of the second flip-flop 404B is a test clock. If the output of the second flip-flop 404B is 1, $SE_i$ is 0, and otherwise $SE_i$ is 1. Thus, a test generation tool is able to set $SE_i$ to either 1 or 0 in the capture phase before arrival of a first capture clock. After the first capture clock, which is also the clock for flip-flop 404A, both the inputs of the multiplexer 400 are 0 and hence $SE_i$ will become 0. Accordingly, the test generation tool can select either the functional path or the scan path to launch the transition.

The individual shift enable signals $SE_i$ generated by the respective launch mode selectors 302 are independent of one another. During a capture phase, individual shift enable signals $SE_i$ can assume different values even though during a scan shift phase, all of them have the same value (e.g., logic level "1"). This gives substantial additional flexibility to the test generation tool, in that it can potentially create more transitions on source scan cells compared with a conventional arrangement in which all the clock domains are using launch-on-shift or all the clock domains are using launch-on-capture. The launch mode can be selected for each clock domain in real time, thereby facilitating test pattern generation and providing better fault coverage for a given test pattern.

In the present embodiment, the second flip-flop 404B is assumed to comprise a particular storage element of a test data register configured to store at least one transition launch mode control bit for each of the plurality of clock domains. The storage element and associated stored control bit for clock domain i are each denoted herein as $TDR_i$. Thus, the notation $TDR_i$ as used herein may refer to either the storage element itself, or the control bit value stored by that storage element. The test data register comprising the $TDR_i$ storage elements can be programmed with the corresponding control bits by the tester 102 or another system element in order to independently set the transition launch mode for each of the N clock domains of the integrated circuit 104.

It should be noted that the storage elements of the above-noted test data register may comprise respective scan cells 206 of one or more of the scan chains 204. For example, these storage elements may be part of the same scan chain that is used control a number of at-speed clock pulses used during transition fault testing.

As a more particular example, the flip-flops 404B in each of the launch mode selectors 302 may be concatenated to form a single scan chain, in order to allow a test generation tool to shift in a test pattern comprising a sequence of control bits that will set the respective launch modes for the respective clock domains. The third flip-flop 404C shown in FIG. 4 may be viewed as the adjacent storage element for a test data register configured in this manner, storing the control bit for another clock domain.

Thus, the test data register can be implemented at least in part using existing scan cells, thereby avoiding the need to provide a separate test data register.

Figure 5:
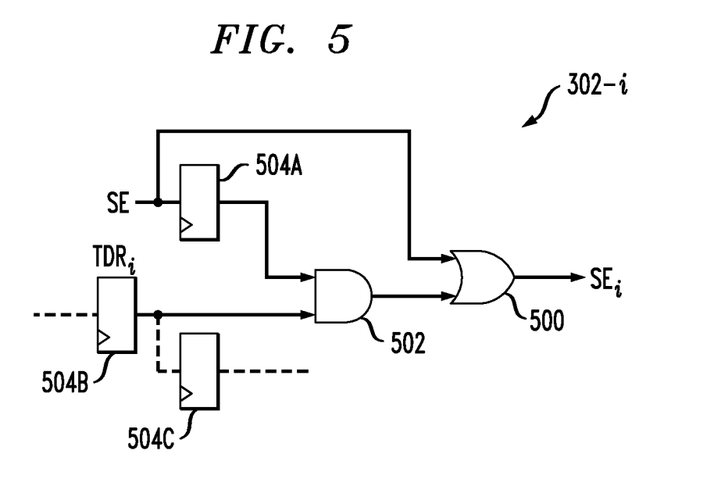

FIG. 5 shows another embodiment of the launch mode selector 302-$i$. Its functionality is substantially the same as that of the FIG. 4 embodiment. The launch mode selector 302-$i$ as shown in the FIG. 5 embodiment comprises a first logic gate 500, a second logic gate 502, and first, second and third flip-flops denoted 504A, 504B and 504C, respectively. The first logic gate 500 is illustratively implemented as a two-input OR gate having a first input adapted to receive the common shift enable signal SE, a second input coupled to an output of the second logic gate 502, and an output providing the independently controllable shift enable signal $SE_i$ for clock domain 304-$i$. The first flip-flop 504A has an input adapted to receive the common shift enable signal SE. The second logic gate 502 is illustratively implemented as a two-input AND gate having a first input coupled to an output of the first flip-flop 504A and a second input coupled to an output of the second flip-flop 504B.

As in the FIG. 4 embodiment, the second flip-flop 504B in the FIG. 5 embodiment comprises a test data register storage element $TDR_i$ storing a control bit for controlling the transition launch mode for clock domain 304-$i$ between the launch-on-shift mode and the launch-on-capture mode.

Figure 6:
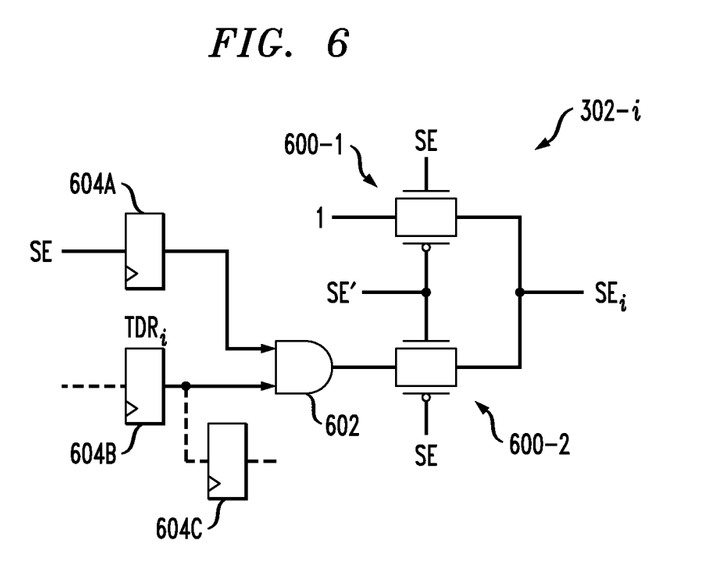

Another embodiment of the launch mode selector 302-$i$ is shown in FIG. 6. Again, its functionality is substantially the same as that of the FIG. 4 and FIG. 5 embodiments, but it has reduced area requirements relative to those embodiments. The launch mode selector 302-$i$ as shown in the FIG. 6 embodiment comprises first and second pairs 600-1 and 600-2 of parallel-connected NMOS and PMOS devices, a logic gate 602, and first, second and third flip-flops denoted 604A, 604B and 604C, respectively. Each of the parallel-connected NMOS-PMOS pairs 600 is configured such that source and drain terminals of the NMOS device are coupled to respective drain and source terminals of the PMOS device. The NMOS and PMOS devices may comprise respective pass gate transistors. The first flip-flop 604A has an input adapted to receive the common shift enable signal SE. The second flip-flop 604B, like the flip-flops 404B and 504B, comprises a test data register storage element $TDR_i$ storing a control bit for controlling the transition launch mode for clock domain 304-$i$ between the launch-on-shift mode and the launch-on-capture mode. The logic gate 602 is illustrative implemented as a two-input AND gate having first and second inputs coupled to respective outputs of the first and second flip-flops 604A and 604B.

In the first NMOS-PMOS pair 600-1, a gate terminal of the NMOS device is adapted to receive the common shift enable signal SE and a gate terminal of the PMOS device is adapted to receive a complement SE' of the common shift enable signal SE.

In the second NMOS-PMOS pair 600-2, a gate terminal of the PMOS device is adapted to receive the common shift enable signal SE and a gate terminal of the NMOS device is adapted to receive the complement SE' of the common shift enable signal SE.

Also, inputs of the respective NMOS-PMOS pairs 600-1 and 600-2 are coupled to a fixed logic level (e.g., a logic "1" level) and an output of the logic gate 602, respectively. Outputs of the NMOS-PMOS pairs 600-1 and 600-2 are coupled together and provide the independently controllable shift enable signal $SE_i$ for clock domain 304-$i$.

The transition launch mode selection circuitry 203 comprising multiple launch mode selectors 302 as described in conjunction with the embodiments of FIGS. 3 through 6 allows launch modes to be selected independently for each of a plurality of clock domains of the integrated circuit 104. The transition launch mode selection circuitry is applicable for use in both compressed and noncompressed scan testing environments.

It is to be appreciated that the particular circuitry arrangements shown in FIGS. 3 through 6 are presented by way of illustrative example only, and numerous alternative arrangements of transition launch mode selection circuitry may be used to provide an ability to independently select different launch modes for different clock domains in the manner disclosed herein. This transition launch mode selection functionality can be implemented in one or more of the illustrative embodiments without any significant negative impact on integrated circuit area requirements or functional timing requirements.

The presence of transition launch mode selection circuitry as described above in conjunction with FIGS. 3 through 6 within integrated circuit 104 may be made apparent to a test generation tool so that the tool can take the transition launch mode selection functionality into account in generating test patterns. In order to accomplish this, one or more input files describing the operation of this circuitry may be provided to the test generation tool.

Figure 7:
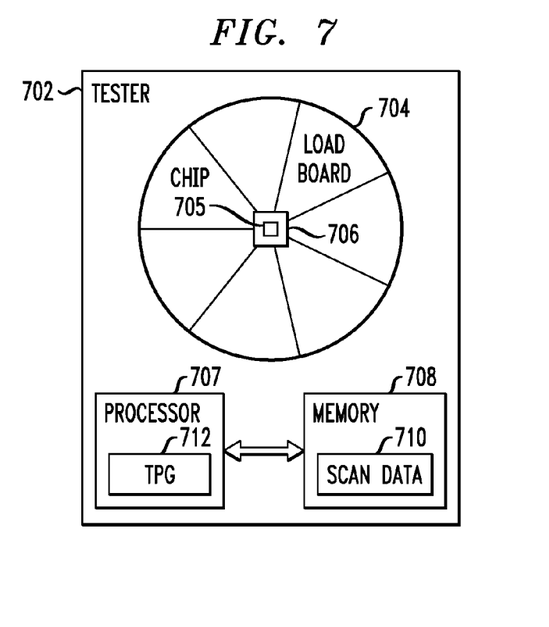
FIG. 7 shows one possible implementation of the testing system of FIG. 1.

The tester 102 in the testing system 100 of FIG. 1 need not take any particular form, and various conventional testing system arrangements can be modified in a straightforward manner to support the transition launch mode selection functionality disclosed herein. One possible example is shown in FIG. 7, in which a tester 702 comprises a load board 704. An integrated circuit 705 to be subject to scan testing using the techniques disclosed herein is installed in a central portion 706 of the load board 704. The tester 702 also comprises processor and memory elements 707 and 708 for executing stored program code. In the present embodiment, processor 707 is shown as implementing a test pattern generator 712. Associated scan data 710 is stored in memory 708. Numerous alternative testers may be used to perform scan testing of an integrated circuit as disclosed herein. Also, as indicated previously, in alternative embodiments one or more portions of an external tester may be incorporated into the integrated circuit itself, as in BIST arrangement.

Figure 8:
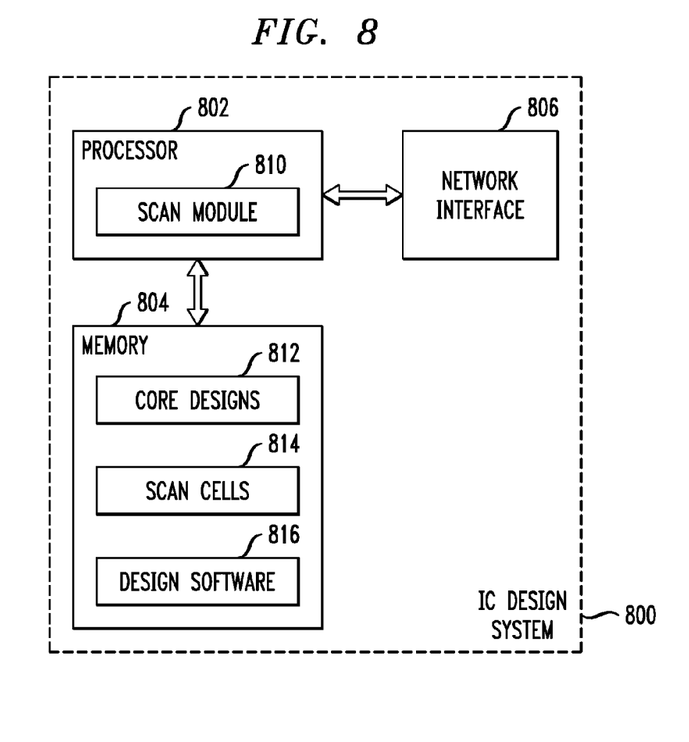
FIG. 8 is a block diagram of a processing system for generating an integrated circuit design comprising transition launch mode selection circuitry of the type illustrated in FIGS. 3 through 6.

The insertion of scan cells to form scan chains having associated transition launch mode selection functionality in scan test circuitry of an integrated circuit design may be performed in a processing system 800 of the type shown in FIG. 8. Such a processing system in this embodiment more particularly comprises a design system configured for use in designing integrated circuits such as integrated circuit 104 to include scan test circuitry 106 having at least a portion of transition launch mode selection circuitry 203.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated transition launch mode selection circuitry in the manner disclosed herein, in conjunction with utilization of integrated circuit design software 816.

By way of example, the scan chain circuitry 106 comprising scan chains 204 and associated transition launch mode selection circuitry may be generated in system 800 using an RTL description and then synthesized to gate level using a specified technology library. A test generation model may then be created for generating test patterns using a test generation tool. Control files or other types of input files may be used to provide the test generation tool with information such as the particular scan cells of each scan chain that are associated with particular clock domains in a given embodiment. Once the corresponding rules are in place, a rule checker may be run so that the test generation tool has visibility of the scan chains taking into account the operation of the transition launch mode selection circuitry. Test patterns may then be generated for the scan chain circuitry.

Elements such as 810, 812, 814 and 816 are implemented at least in part in the form of software stored in memory 804 and processed by processor 802. For example, the memory 804 may store program code that is executed by the processor 802 to implement particular scan chain and transition launch mode selection functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices.

As indicated above, embodiments of the invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the embodiments of the invention as described herein are intended to be illustrative only. For example, other embodiments of the invention can be implemented using a wide variety of other types of scan test circuitry, with different types and arrangements of transition launch mode selection circuitry, associated launch mode selectors, scan cells and other elements, as well as different types and arrangements of logic gates, shift enable signaling and scan test pattern generation, than those included in the embodiments described herein. These and numerous other alternative embodiments within the scope of the following claims will be readily apparent to those skilled in the art.

What is claimed is:

1. An integrated circuit comprising:
   scan test circuitry; and
   additional circuitry subject to testing utilizing the scan test circuitry;
   the scan test circuitry comprising at least one scan chain having a plurality of scan cells;
   the scan test circuitry further comprising transition launch mode selection circuitry configured to provide independent selection between multiple transition launch modes for each of a plurality of clock domains comprising respective sets of the scan cells.

2. The integrated circuit of claim 1 wherein the multiple transition launch modes comprise at least a launch-on-shift mode and a launch-on-capture mode.

3. The integrated circuit of claim 1 wherein the multiple transition launch modes involve application of different shift enable signal logic levels to one or more of the scan cells in a corresponding one of the clock domains.

4. The integrated circuit of claim 1 wherein the multiple transition launch modes provide different manners of launching a given signal transition via at least one of the scan cells in a corresponding one of the clock domains.

5. The integrated circuit of claim 1 wherein the transition launch mode selection circuitry is configured to generate from a common shift enable signal multiple independently controllable shift enable signals for respective ones of the clock domains of the integrated circuit.

6. The integrated circuit of claim 5 wherein a designated logic level of a given one of the shift enable signals is associated with a particular selected one of the multiple transition launch modes.

7. The integrated circuit of claim 1 wherein the transition launch mode selection circuitry comprises a plurality of transition launch mode selectors for independently selecting between a launch-on-shift mode and a launch-on-capture mode for respective ones of the clock domains of the integrated circuit.

8. The integrated circuit of claim 7 wherein a given one of the transition launch mode selectors corresponding to a particular one of the clock domains comprises:
   first and second flip-flops;
   a logic gate; and
   a multiplexer having a first input adapted to receive a common shift enable signal, a second input coupled to an output of the first flip-flop, a select line coupled to an output of the logic gate, and an output providing an independently controllable shift enable signal for the particular clock domain;
   the logic gate having a first input adapted to receive the common shift enable signal, and a second input coupled to an output of the second flip-flop; and
   the second flip-flop storing a control bit for controlling the transition launch mode between the launch-on-shift mode and the launch-on-capture mode.

9. The integrated circuit of claim 8 wherein the logic gate comprises an OR gate.

10. The integrated circuit of claim 8 wherein the second flip-flop comprises a particular storage element of a test data register configured to store at least one transition launch mode control bit for each of the plurality of clock domains.

11. The integrated circuit of claim 7 wherein a given one of the transition launch mode selectors corresponding to a particular one of the clock domains comprises:
   first and second flip-flops;
   a first logic gate; and
   a second logic gate;
   the first logic gate having a first input adapted to receive a common shift enable signal, a second input coupled to an output of the second logic gate, and an output providing an independently controllable shift enable signal for the particular clock domain;
   the first flip-flop having an input adapted to receive the common shift enable signal;
   the second logic gate having a first input coupled to an output of the first flip-flop and a second input coupled to an output of the second flip-flop; and the second flip-flop storing a control bit for controlling the transition launch mode between the launch-on-shift mode and the launch-on-capture mode.

12. The integrated circuit of claim 11 wherein the first and second logic gates comprise respective OR and AND gates.

13. The integrated circuit of claim 7 wherein a given one of the transition launch mode selectors corresponding to a particular one of the clock domains comprises:
   first and second flip-flops;
   a logic gate; and
   first and second pairs of parallel-connected NMOS and PMOS devices, with each such NMOS-PMOS pair being configured such that source and drain terminals of the NMOS device are coupled to respective drain and source terminals of the PMOS device;
   the first flip-flop having an input adapted to receive the common shift enable signal;
   the second flip-flop storing a control bit for controlling the transition launch mode between the launch-on-shift mode and the launch-on-capture mode;
   the logic gate having first and second inputs coupled to respective outputs of the first and second flip-flops;
   a first one of the NMOS-PMOS pairs having a gate terminal of the NMOS device adapted to receive a common shift enable signal and a gate terminal of the PMOS device adapted to receive a complement of the common shift enable signal;
   a second one of the NMOS-PMOS pairs having a gate terminal of the PMOS device adapted to receive the common shift enable signal and a gate terminal of the NMOS device adapted to receive the complement of the common shift enable signal;
   wherein inputs of the respective NMOS-PMOS pairs are coupled to a fixed logic level and an output of the logic gate, respectively; and
   wherein outputs of the NMOS-PMOS pairs are coupled together and provide an independently controllable shift enable signal for the particular clock domain.

14. A processing device comprising the integrated circuit of claim 1.

15. The processing device of claim 14 wherein the integrated circuit comprises a disk drive controller.

16. A method comprising:
   configuring at least one scan chain to include a plurality of scan cells; and
   independently selecting between multiple transition launch modes for each of a plurality of clock domains comprising respective sets of the scan cells.

17. The method of claim 16 wherein the selecting step further comprises generating from a common shift enable signal multiple independently controllable shift enable signals for respective ones of the clock domains of the integrated circuit.

18. The method of claim 16 wherein the selecting step further comprises independently selecting between a launch-on-shift mode and a launch-on-capture mode for respective ones of the clock domains of the integrated circuit.

19. A computer program product comprising a computer-readable storage medium having computer program code embodied therein for use in scan testing an integrated circuit, wherein the computer program code when executed in a testing system causes the testing system to perform the steps of the method of claim 16.

20. A processing system comprising:
   a processor; and
   a memory coupled to the processor and configured to store information characterizing an integrated circuit design;
   wherein the processing system is configured to provide scan test circuitry within the integrated circuit design, the scan test circuitry comprising at least one scan chain having a plurality of scan cells;
   the scan test circuitry further comprising transition launch mode selection circuitry configured to provide independent selection between multiple transition launch modes for each of a plurality of clock domains comprising respective sets of the scan cells of the integrated circuit.

* * * * *